United States Patent
Okase et al.

(10) Patent No.: US 6,497,767 B1
(45) Date of Patent: Dec. 24, 2002

(54) THERMAL PROCESSING UNIT FOR SINGLE SUBSTRATE

(75) Inventors: Wataru Okase, Sagamihara (JP); Yasushi Yagi, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/570,571

(22) Filed: May 12, 2000

(30) Foreign Application Priority Data

May 14, 1999 (JP) ............................................. 11-133602

(51) Int. Cl.[7] ............................................... C23C 16/00
(52) U.S. Cl. ........................ 118/666; 118/712; 118/724; 118/725; 118/729
(58) Field of Search ................................. 118/715, 724, 118/725, 729, 666, 712

(56) References Cited

U.S. PATENT DOCUMENTS

| | | | | |
|---|---|---|---|---|
| 5,273,588 A | * | 12/1993 | Foster | 118/715 |
| 5,418,885 A | * | 5/1995 | Hauser | 392/411 |
| 5,446,825 A | * | 8/1995 | Moslehi | 392/416 |
| 5,688,331 A | * | 11/1997 | Aruga | 118/725 |
| 5,796,074 A | * | 8/1998 | Edelstein | 118/725 |
| 5,855,675 A | * | 1/1999 | Doering | 118/725 |
| 5,916,370 A | * | 6/1999 | Chang | 118/729 |
| 6,001,183 A | * | 12/1999 | Gurary | 118/730 |
| 6,190,113 B1 | * | 2/2001 | Bui | 118/729 |
| 6,190,460 B1 | * | 2/2001 | Hwang | 118/729 |

FOREIGN PATENT DOCUMENTS

| | | | | |
|---|---|---|---|---|
| JP | 62-4315 | * | 1/1987 | |
| JP | 3-73527 | * | 3/1991 | ............ 118/723 E |
| JP | 7-221154 | | 8/1995 | |

* cited by examiner

Primary Examiner—Richard Bueker
(74) Attorney, Agent, or Firm—Smith, Gambrell & Russell, LLP

(57) ABSTRACT

A thermal processing unit for a single substrate of the invention includes a processing chamber vessel whose inside can be made a predetermined atmosphere of a process gas, and an elevating shaft which can be moved up and down in the processing chamber vessel. A supporting body which can support a substrate is arranged on an upper end of the elevating shaft. The substrate supported by the supporting body is adapted to be heated by a heater. The supporting body has a circular supporting part which can support a substantially full surface of a peripheral area of the substrate, and a pushing-up member which can push up the substrate from on the supporting part for conveying the substrate. According to the invention, concentration of stress onto the substrate can be restrained, and a thermal process can be conducted uniformly within a surface of the substrate because heating from a peripheral area of the substrate may be restrained. In addition, the substrate can be easily conveyed although the substantially full surface of the peripheral area of the substrate is supported.

15 Claims, 3 Drawing Sheets

THERMAL PROCESSING UNIT FOR SINGLE SUBSTRATE

BACKGROUND OF THE INVENTION

1. Field of the Invention

This invention relates to a thermal processing unit for a single substrate.

2. Disclosure of the Prior Art

In some processes for manufacturing semiconductor device, various types of thermal processing unit are used in order to conduct a process such as an oxidation, a diffusion, a CVD or an annealing onto a substrate such as a semiconductor wafer. As one of the thermal processing units, a thermal processing unit for a single substrate is known, which can conduct a thermal process to semiconductor wafers one by one. The thermal processing unit for a single substrate can conduct a thermal process involving a rapid rise and fall of temperature thereof, which is suitable for large-sized semiconductor wafers and/or minute semiconductor devices.

In a conventional hot-wall type of the thermal processing unit for a single substrate, a single semiconductor wafer as a single substrate is conveyed into a processing chamber while supported by a supporting body attached on an upper end of an elevating shaft. Then, the semiconductor wafer is heated in a predetermined atmosphere of a process gas by a heater arranged outside the processing chamber in order to undergo a thermal process. In the case, the supporting body is adapted to support a lower surface of the semiconductor wafer with a plurality of points, for example with three points. A preprocessed semiconductor wafer is conveyed onto the supporting body by a conveying arm arranged at a platform side. After the semiconductor wafer has undergone the thermal process, the semiconductor wafer is conveyed out from the supported body.

However, in the conventional thermal processing unit for a single substrate, the semiconductor wafer is supported with the three points while undergoing the thermal process. Thus, stress tends to concentrate on each of the three points, which may cause a crystal defect. In addition, heat is given to the semiconductor wafer mainly from a peripheral area (edge area) thereof. Thus, in heating the semiconductor wafer, a temperature of a central area thereof may be delayed rising with respect to that of t he peripheral area thereof. As a result, ununiformity (difference) in temperature distribution within a surface of the wafer may be caused in the heating process.

This invention is intended to solve the above problems effectively. An object of this invention is to provide a thermal processing unit for a single substrate that can restrain concentration of stress onto the substrate and conduct a thermal process uniformly within a surface of the substrate.

SUMMARY OF THE INVENTION

This invention is characterized by a feature wherein a thermal processing unit for a single substrate comprises: a processing chamber vessel whose inside can be made a predetermined atmosphere of a process gas; an elevating shaft which can be moved up and down in the processing chamber vessel; a supporting body arranged on an upper end of the elevating shaft, which can support a substrate; and a heater for heating the substrate supported by the supporting body; wherein the supporting body has a circular supporting part which can support a substantially full surface of a peripheral area of the substrate, and a pushing-up member which can push up the substrate from the supporting part for conveying the substrate.

According to the feature, concentration of stress onto the substrate can be restrained, and a thermal process can be conducted uniformly within a surface of the substrate because heating from a peripheral area of the substrate may be restrained. In addition, the substrate can be easily conveyed although the substantially full surface of the peripheral area of the substrate is supported.

Preferably, a ring part is provided on the supporting part for surrounding the peripheral area of the substrate.

Preferably, the pushing-up part has a plurality of point-supporters.

For example, the elevating shaft has an outside pipe and an inside rod, the supporting part of the supporting body is provided on an upper end of the outside pipe, and the pushing-up member of the supporting body is provided on an upper end of the inside rod.

In the case, preferably, a temperature measuring gauge is connected to the inside rod of the elevating shaft. Alternatively, a temperature measuring gauge is connected to the outside pipe of the elevating shaft.

Preferably, the outside pipe of the elevating shaft and the circular supporting part of the supporting body are hermetically connected via a tubular or funnel-shaped connector.

Preferably, a built-in heater is incorporated in the supporting body for maintaining a temperature of the supporting body at a substantially constant temperature.

In the case, preferably, the supporting body has a bottom part facing a central area of the substrate, and the built-in heater is provided in the bottom part. More preferably, the bottom part is formed convexly toward the central area of the substrate, and the built-in heater is also arranged convexly toward the central area of the substrate.

In addition, a showerhead may be provided at an upper portion of the processing chamber vessel for introducing a process gas into the processing chamber vessel. In the case, preferably, the showerhead is formed convexly toward the central area of the substrate.

In addition, for example, the heater is arranged outside the processing chamber vessel in such a manner that the heater oppositely faces a surface of the substrate. In the case, the heater may consist of a resistance heater.

Alternatively, the heater is arranged outside the processing chamber vessel and spherically around a center of the substrate. In the case, the heater may consist of a plurality of heating lamps. Preferably, a heat-radiating direction of each of the plurality of heating lamps is adjustable.

In addition, preferably, an assistant heater is provided outside the processing chamber vessel for heating an area other than a thermal processing area for the substrate.

DESCRIPTION OF THE PREFERRED EMBODIMENT

Embodiments of the invention will now be described in more detail with reference to FIGS. 1 to 6.

Figure 1:
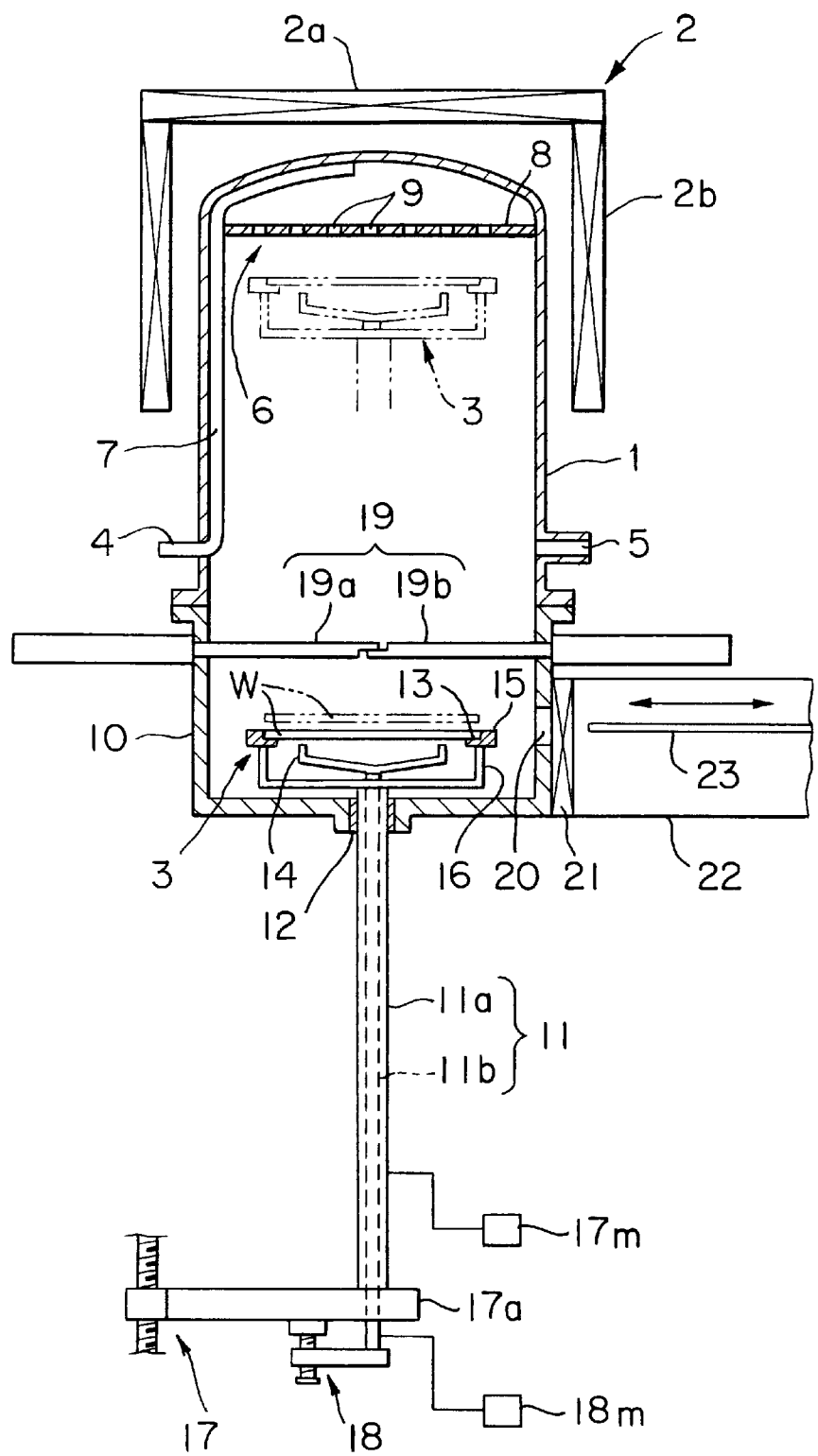
FIG. 1 is a schematic longitudinal sectional view of an embodiment of a thermal processing unit for a single substrate according to the invention.

FIG. 1 is a schematic longitudinal sectional view of an embodiment of a thermal processing unit for a single substrate according to the invention. A processing tube (a processing chamber vessel) 1 can accommodate a substrate such as a semiconductor wafer w. The processing tube 1 has a vertical cylindrical shape whose upper end is closed and whose lower end is opened. The processing tube 1 is made of a heat-resistant material such as crystal. Thus, the processing tube 1 is suitable for conducting a predetermined thermal process such as a CVD process onto the semiconductor wafer w. A supporting body 3 is adapted to horizontally support the semiconductor wafer w at a thermal processing area in the processing tube 1. Herein, the processing tube 1 may consist of double pipes.

A heater 2 consisting of a resistance heater is arranged outside and above the processing tube 1. The heater 2 is adapted to heat a semiconductor wafer supported in the processing tube 1 to a high temperature such as 800 to 1200° C. by heat radiation. Herein, the heater 2 may consist of one or more heating lamps as described below.

The heater 2 has an upper heating portion 2a which is horizontal and adapted to oppositely face an upper surface (a surface to be processed) of the semiconductor wafer w accommodated in the processing tube 1 in order to heat the semiconductor wafer w uniformly within the surface thereof. The heater 2 also has a peripheral heating portion 2b which has a hollow cylindrical shape to encircle an upper portion of the processing tube 1. Herein, a soaking body, for example made of silicon carbide (SiC), may be arranged between the heater 2 and the processing tube 1.

An introducing port 4 for introducing a predetermined process gas and/or an inert gas into the processing tube 1 is provided through a lower portion of the processing tube 1. An exhausting port 5 for exhausting the gas or gases from the processing tube is also provided through another lower portion of the processing tube 1. The introducing port 4 is connected to a gas supplying system (not shown). The exhausting port 5 is connected to a gas exhausting system (not shown).

A showerhead 6 is provided at an upper portion of the processing tube 1 for jetting out the process gas in a downward direction. The introducing port 4 is connected to a gas passage 7 extending from the lower portion of the processing tube 1 to a space between a ceiling of the processing tube 1 and the showerhead 6. Thus, the process gas and/or the inert gas may be introduced into the space between the processing tube 1 and the showerhead 6. The showerhead consists of a flat plate 8 having a large number of jetting holes 9 and is made of for example crystal. If the processing tube 1 consists of an outside pipe and an inside pipe, the gas or gases may be introduced into an upper space of the showerhead through a gap between the outside pipe and the inside pipe.

A lower end of the processing tube 1 is connected to an operating chamber 10 which is used for conveying the semiconductor wafer w into and out of the processing tube 1. The operating chamber 10 has a box shape whose upper portion is opened, and is made of a heat-resistant and corrosion-resistant material, for example stainless steel. An elevating shaft 11 extending in a vertical direction movably passes through a central portion of a bottom part of the operating chamber 10. The elevating shaft may be made of any material, for example crystal. The central portion of the bottom part of the operating chamber 10, which the elevating shaft 11 passes through, is hermetically sealed by a sealing member 12.

Figure 2:
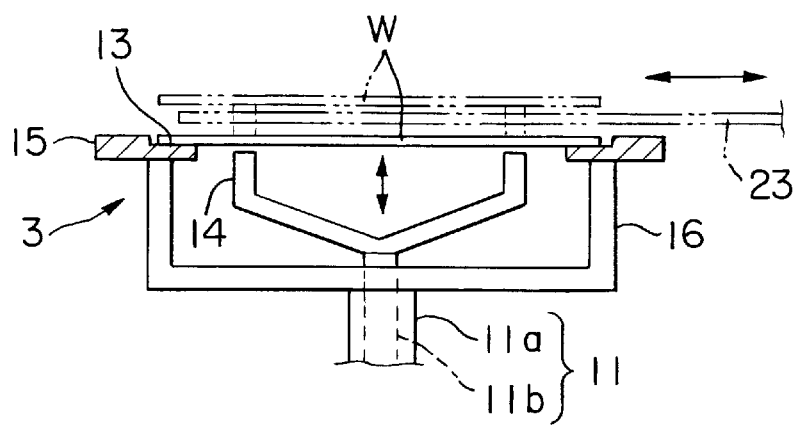
FIG. 2 is a schematic sectional view of a supporting body of the embodiment of the thermal processing unit shown in FIG. 1.

A supporting body 3 is provided at an upper end of the elevating shaft 11. The supporting body 3 is adapted to support a single semiconductor wafer w horizontally. The supporting body 3 may be made of any material, for example crystal. As shown in FIG. 2, the supporting body 3 has a circular supporting part 13 which can support a substantially full lower surface of a peripheral area of the semiconductor wafer w. The supporting body 3 also has a pushing-up member 14 which can push up the semiconductor wafer w from on the supporting part 13 for conveying the semiconductor wafer w.

A ring part 15 is provided on the supporting part 13 for surrounding the peripheral area of the semiconductor wafer w. The ring part 15 may be made of any material, for example crystal. The supporting part 13 and the ring part 15 may be formed integrally. The ring part 15 functions to restrain heat radiated from the heater 2 from being given to the peripheral area of the semiconductor wafer w. In addition, as a thermal capacity of the ring part 15 and the supporting part 13 is increased, a temperature of the peripheral area of the semiconductor wafer w may be restrained to be raised. In addition, as the ring part 15 encircles the peripheral area of the semiconductor wafer w, the semiconductor wafer w may be easily positioned and may be prevented from falling off the supporting part 13 because of vibration during a vertical movement thereof or during a thermal process.

The elevating shaft 11 has an outside pipe (or hollow rod) 11a and an inside rod 11b movably inserted into the outside pipe 11a. The supporting body 3 is supported at an upper end of the outside pipe 11a. The pushing-up member 14 is provided at an upper end of the inside rod 11b.

In detail, the supporting body 3 is provided on a plurality of supporting arms 16 which diverge in an upward direction from the upper end of the outside pipe 11a. The pushing-up member 14 consists of a plurality of point-supporters, for example three point-supporters, which diverge in an upward direction. In the case, the pushing-up member 14 is adapted to support the lower surface of the peripheral area of the semiconductor wafer w on a plurality of points, for example three points.

A lower end of the outside pipe 11a of the elevating shaft 11 is attached to an elevating arm 17a of an elevating mechanism 17, which may comprise for example a ball-screw or the like. Thus, when the elevating arm 17a is driven to elevate up (go up), the semiconductor wafer w while supported by the supporting part 13 may be conveyed up from the operating chamber 10 into the processing tube 1. On the contrary, when the elevating arm 17a is driven to elevate down (go down), the semiconductor wafer w while supported by the supporting body 13 may be conveyed down from the processing tube 1 into the operating chamber 10.

In addition, as shown in FIG. 1, in order to move up and down the pushing-up member 14 (i.e. the inside rod 11b of the elevating shaft 11), the elevating arm 17a has a vertical moving mechanism 18, which may comprise for example a ball-screw or an air-cylinder to move up and down a lower end of the inside rod 11b.

A shutter 19 is provided between the inside of the operating chamber 10 and the inside of the processing tube 1. The shutter 19 can be opened or closed to allow or cut off a heat conduction therebetween. The shutter 19 may consist of a pair of horizontal shutter-plates 19a and 19b which are arranged right and left and which may come close to and apart from each other by an air-cylinder or the like. In addition, an entrance port 20 is arranged at a portion of a side wall of the operating chamber 10 in order to convey the semiconductor wafer w from the outside onto the supporting body 3 or vice verse. A gate valve 21 is provided at the entrance port 20.

The operating chamber 10 is connected to a conveying chamber 22 at a platform side via the entrance port 20 and the gate valve 21. A conveying arm mechanism is provided in the conveying chamber 22. The conveying arm mechanism has a conveying arm 23 movable in a horizontal direction, which can take out a semiconductor wafer from a cassette including a plurality of semiconductor wafers, for example 25 semiconductor wafers, convey the semiconductor wafer onto the supporting body 3 in the operating chamber 10, receive the semiconductor wafer after processed from the supporting body 3 and set back the semiconductor wafer into the cassette. A point portion of the conveying arm 23 is flat and U-shaped so that the conveying arm 23 is suitable for holding the semiconductor wafer w.

When the semiconductor wafer w is conveyed onto the supporting body 3, at first the conveying arm 23 conveys the semiconductor wafer w to a space above the supporting body 3. Then, the pushing-up member 14 is raised to push up the semiconductor wafer w from on the conveying arm 23. Then, the conveying arm 23 is moved backward, and the pushing-up member 14 is lowered so that the semiconductor wafer w is placed on the supporting part 13. On the contrary, when the semiconductor wafer w is conveyed out from on the supporting body 3, at first the pushing-up member 14 is raised to push up the semiconductor wafer w from on the supporting body 3. Then, the conveying arm 23 is moved to a space between the supporting part 13 and the semiconductor wafer w, and the pushing-up member 14 is lowered so that the semiconductor wafer w is placed on the conveying arm 23. Then, the conveying arm 23 is moved backward to convey the semiconductor wafer w into the conveying chamber 22.

Next, an operation of the thermal processing unit for a single substrate described above is explained hereinafter.

At first, the supporting body 3 which is provided on the upper end of the elevating shaft 11 is positioned in the operating chamber 10. Then, the semiconductor wafer w is conveyed onto the supporting part 13 of the supporting body 3 through the entrance port 20 by the conveying arm 23. In the case, the inside rod 11b of the elevating shaft 11 i.e. the pushing-up member 14 is raised by the vertical moving mechanism 18, so that the semiconductor wafer w is pushed up from on the conveying arm 23. Then, the conveying arm 23 is moved backward and the vertical moving mechanism 18 lowers the pushing-up member 14, so that the semiconductor wafer w is placed on the supporting part 13 of the supporting body 3.

After the semiconductor wafer w has been conveyed onto the supporting part 13 of the supporting body 3, the shutter 19 is opened and the supporting body 3 is raised to a thermal processing area (a thermal processing position) in the processing tube 1. Then, the heater 2 starts to heat the semiconductor wafer w, and the predetermined process gas is jetted onto the upper surface of the semiconductor wafer w through the showerhead 6. Thus, a predetermined thermal process is started. During the thermal process, it is preferable to close the shutter 19. More preferably, hermetically the shutter 19 encircles the elevating shaft 11.

After the thermal process has been completed, the shutter 19 is opened for a time, and the supporting body 3 is lowered into the operating chamber 10. Then, the shutter 19 is closed again. In order to restrain an undesired reaction after the thermal process, it is preferable to change jetted gas from the process gas to an inert gas such as nitrogen gas ($N_2$). In the case, the process gas in the processing tube 1 may be replaced with the inert gas. In addition, it is preferable to lower a temperature of the heater 2.

Then, the processed semiconductor wafer w is conveyed out from on the supporting body 3 by the conveying arm 23. When the semiconductor wafer w is conveyed out from on the supporting body 3, at first the vertical moving mechanism 18 raises the pushing-up member 14 to push up the semiconductor wafer w from the supporting position. Then, the conveying arm 23 is moved to the space between the supporting part 13 and the semiconductor wafer w. Then, the vertical moving mechanism 18 lowers the pushing-up member 14 so that the semiconductor wafer w is placed on the conveying arm 23. Then, the conveying arm 23 is moved backward to convey the semiconductor wafer w into the conveying chamber 22. After that, another preprocessed semiconductor wafer w is conveyed onto the supporting body 3. Semiconductor wafers undergo the thermal process one by one continuously according to an above cycle.

According to the thermal processing unit for a single substrate of the embodiment, since the supporting body 3 has the circular supporting part 13 which can support the substantially full lower surface of the peripheral area of the semiconductor wafer w, concentration of stress onto the semiconductor wafer w can be restrained, differently from a case using point-supporters. In addition, more rarely crystal defect may be caused.

In addition, the thermal capacity of the circular supporting part 13 is so large that rise of the temperature of the peripheral area of the semiconductor wafer w may be restrained. Thus, the temperature of the semiconductor wafer w may be raised uniformly within the surface of the semiconductor wafer w. In addition, since the ring part 15 is provided in such a manner that the ring part 15 encircles the peripheral edge of the semiconductor wafer w, heating from the peripheral area of the semiconductor wafer w may be restrained. Thus, the thermal process can be conducted more uniformly within the surface of the semiconductor wafer w. The ring part 15 may be made of any material such as polysilicon, preferably crystal.

In addition, the supporting body 3 includes the pushing-up member 14 for pushing up the semiconductor wafer w from the supporting position thereof in order to convey the semiconductor wafer w. Thus, the circular supporting part 13 does not disturb to convey the semiconductor wafer so that the semiconductor wafer w can be easily conveyed although the substantially full surface of the peripheral area of the semiconductor wafer is supported.

In addition, since the elevating shaft 11 has the outside pipe 11a and the inside rod 11b, the supporting body 3 is provided on the upper end of the outside pipe 11a and the pushing-up member 14 is provided on the upper end of the inside rod 11b, the pushing-up member 14 can be easily operated by a simple mechanism such as the vertical moving mechanism 18.

In the embodiment, the inside rod 11b is made of transparent crystal. The pushing-up member 14 provided at one end of the inside rod 11b is near to the semiconductor wafer w. The other end of the inside rod 11b is out of the processing tube 1. Thus, heat rays (infrared rays) radiated from the semiconductor wafer w can be taken out by a temperature measuring gauge 18 m through the pushing-up member 14 and the inside rod 11b to detect (measure) a temperature of the semiconductor wafer w. Thus, the temperature of the semiconductor wafer w may be easily controlled by any simple structure.

Similarly, a temperature of the supporting body 3 may be controlled by detecting a temperature of another portion of the supporting body 3. For example, preferably, the temperature of the portion of the supporting body 3 may be detected by a temperature measuring gauge 17 m through the outside pipe 11a.

Figure 3:
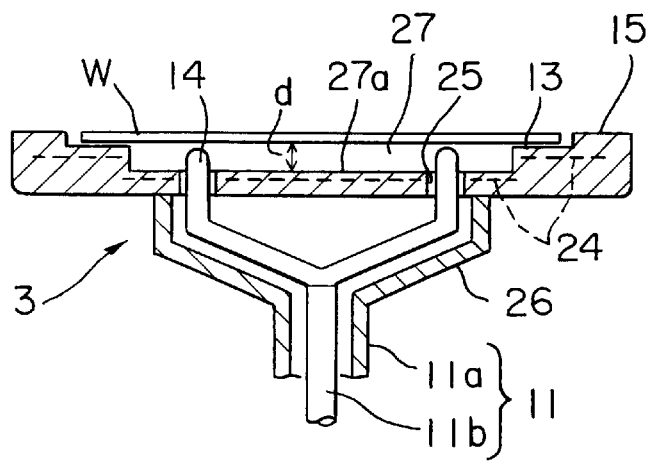
FIG. 3 is a schematic sectional view of a modified example of a supporting body.

FIG. 3 is a schematic sectional view of a modified example of a supporting body. Regarding the supporting body 3 shown in FIG. 3, the same numeral references correspond to substantially the same structures as the above embodiment. A supporting body 3 has a plate-like shape or a dish-like shape. A circular supporting part 13 which can support the substantially full lower surface of the peripheral area of the semiconductor wafer w is formed at a peripheral area of the supporting body 3. A ring part 15 is provided on the supporting part 13 for surrounding the peripheral area of the semiconductor wafer w.

A temperature of the supporting body 3 is normal in early stages, but is gradually raised during a thermal process. A speed of rise of the temperature of the supporting body 3 is lower than that of the semiconductor wafer w. Then, the supporting body 3 tends to give thermal influence to the semiconductor wafer W during the thermal process. Thus, it is preferable to maintain the temperature of the supporting body 3 at a substantially constant temperature at all times in order to restrain thermal influence from the supporting body 3 to the semiconductor wafer w. For example, as shown in FIG. 3, a built-in heater 24 is incorporated in the supporting body 3 in order to maintain the temperature of the supporting body 3 at a substantially constant value. Preferably, the heater 24 is a crystal heater consisting of a resistance heater and a crystal sealingly surrounding the resistance heater.

A through hole 25 is formed at a bottom part of the supporting body 3 for allowing the pushing-up member 14 to pass through. On the upper end of the outside pipe 11a of the elevating shaft 11, instead of the plurality of supporting arms, a tubular or funnel-shaped supporter (connector) 26 is provided for hermetically surrounding the pushing-up member 14 and for hermetically supporting a lower portion of the supporting body 3.

According to the thermal processing unit for a single substrate having the supporting body described above, since the supporting body 3 has the built-in heater 24, the temperature of the supporting body 3 can be maintained at a substantially fixed value. Thus, the thermal influence from the supporting body 3 to the semiconductor wafer w can be restrained, so that the thermal process can be conducted at a substantially constant condition at all times.

In addition, a gas can be supplied into a space between the outside pipe 11a and the inside rod 11b, a space in the supporter 26 and a space under the semiconductor wafer w through the through hole 25. Thus, for example, if an inert gas such as nitrogen gas ($N_2$) is supplied, film-forming on the lower surface of the semiconductor wafer w may be prevented. If a film-forming promoting gas such as hydrogen gas ($H_2$) is supplied, film-forming on the lower surface of the semiconductor wafer w may be promoted.

Figure 4:
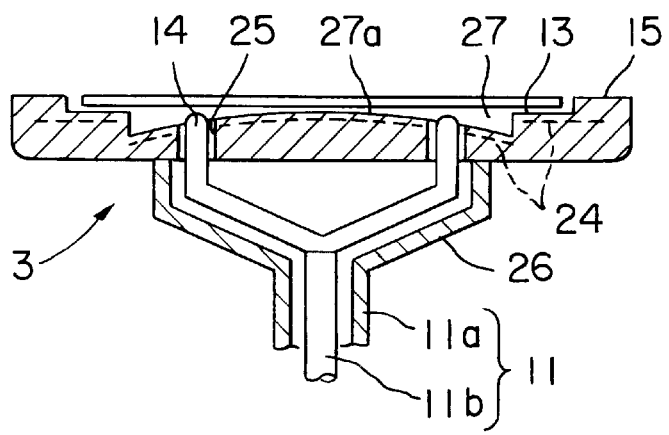
FIG. 4 is a schematic sectional view of another modified example of a supporting body.

FIG. 4 is a schematic sectional view of another modified example of a supporting body. The supporting body 3 shown in FIG. 4 is substantially similar to the supporting body shown in FIG. 3. However, in the supporting body 3 shown in FIG. 3, a recess 27 formed inside the supporting part 13 has a constant depth d. That is, a constant gap is formed between a bottom 27a of the recess 27 and the semiconductor wafer w, and the bottom 27a of the recess 27 is flat. On the other hand, in the supporting body 3 shown in FIG. 4, the bottom 27a of the recess 27 is formed convexly toward a central area of the semiconductor wafer w, i.e., a depth (gap) of the recess at a central area thereof is smaller than a depth (gap) of the recess at a peripheral area thereof. Correspondingly, the built-in heater 24 shown in FIG. 4 is also arranged convexly toward the central area of the semiconductor wafer w. In the case, a gap between the bottom 27a of the recess 27 and the heater 24 is substantially constant.

According to the supporting body 3 shown in FIG. 4, since the convex bottom 27a is nearer to the lower surface of the semiconductor wafer w at the central area, the heater 24 in the supporting body 3 can heat the central area of the semiconductor wafer w, whose temperature tends to be later in rising than that of the peripheral area of the semiconductor wafer w, more positively. Thus, the temperature of the semiconductor wafer w can be raised more uniformly within the surface thereof.

Figure 5:
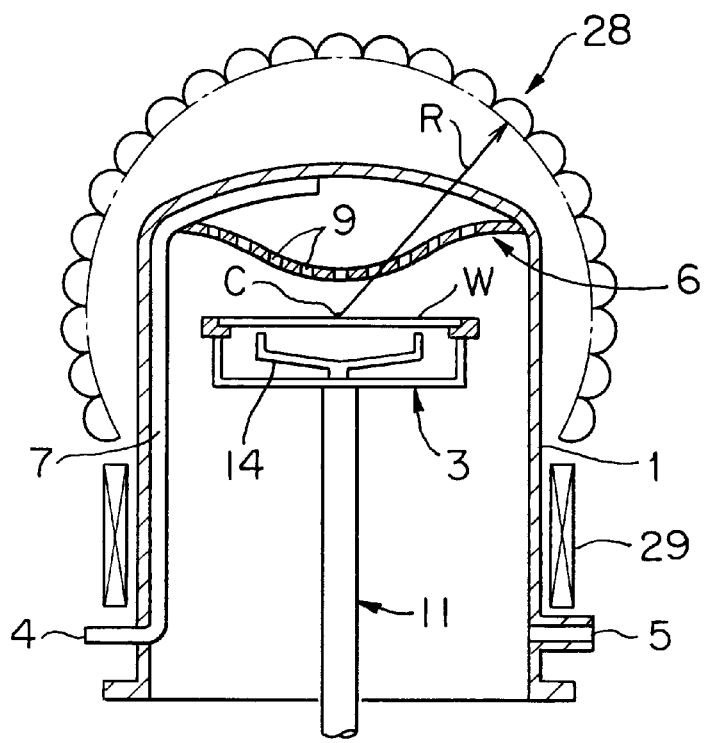
FIG. 5 is a schematic longitudinal sectional view of a modified embodiment of a thermal processing unit for a single substrate.

FIG. 5 is a schematic longitudinal sectional view of a modified embodiment of a thermal processing unit for a single substrate. In the modified embodiment, a large number of heating lamps 28 are used as a heater. Each of the heating lamps 28 may be any lamp, for example a halogen lamp. The large number of heating lamps 28 are arranged outside the processing tube 1 and on a spherical surface with a predetermined radius R from a center c of the semiconductor wafer w supported at the thermal processing area in the processing tube 1. Thus, the large number of heating lamps 28 have the same configuration coefficient with respect to the semiconductor wafer w.

A lower portion of the processing tube 1 is not directly heated by the heating lamps 28, differently from an upper portion thereof. Thus, a temperature of the lower portion is normal in early stages, but is gradually raised to a substantially constant temperature by heat conduction from the upper portion during thermal processes. Thus, when the semiconductor wafer w passes through an area other than the thermal processing area in the processing tube 1, thermal influence to the semiconductor wafer w may fluctuate. Then, in order to restrain the fluctuation, an assistant heater 19 is provided outside the lower portion of the processing tube 1 for heating an area other than the thermal processing area in the processing tube 1.

A showerhead 6 provided at the upper portion of the processing tube 1 is not flat but convex in such a manner that a central area thereof is nearer to a central area of the semiconductor wafer w. Thus, a process gas heated by the heating lamps 28 is supplied to the central area of the semiconductor wafer w at a closer range. Thus, rise of a temperature of the central area of the semiconductor wafer w may be promoted.

According to the thermal processing unit for a single substrate described above, since the heating lamps 28 are used as the heater and the heating lamps 28 are arranged spherically around the center c of the semiconductor wafer w supported at the thermal processing area so that the heating lamps 28 have the same configuration coefficient with respect to the semiconductor wafer w, the semiconductor wafer w can undergo a thermal process uniformly within the surface thereof.

In addition, since the assistant heater 29 is provided for heating the area other than the thermal processing area in the processing tube 1, fluctuation of the thermal influence to the semiconductor wafer w can be restrained even when the semiconductor wafer w passes through the area other than the thermal processing area in the processing tube 1. Thus, thermal history of the semiconductor wafer w can be maintained in a suitable range, which can improve a quality of the processed semiconductor wafer.

In addition, since the showerhead 6 is formed convexly in such a manner that the central area thereof is nearer to the central area of the semiconductor wafer w, the process gas heated by the heating lamps 28 is jetted to the central area of the semiconductor wafer w at the closer range. Thus, the rise of the temperature of the central area of the semiconductor wafer w, which tends to be later than that of the peripheral area thereof, may be promoted so that the temperature of the semiconductor wafer w can be raised more uniformly within the surface thereof.

Figure 6:
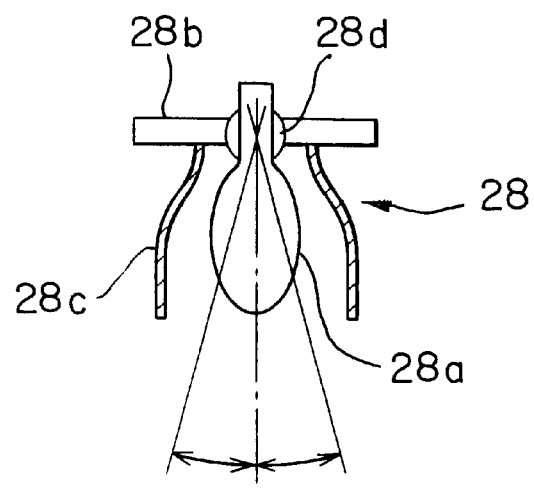
FIG. 6 is a schematic sectional view of a modified example of a heating lamp.

FIG. 6 is a schematic sectional view of a modified example of a heating lamp. As shown in FIG. 6, preferably, each of the large number of heating lamps 28 arranged spherically may be formed in such a manner that a heat-radiating direction thereof is adjustable. In the case, each of the heating lamps 28 mainly consists of a lamp body (light bulb) 28a, a lamp supporter 28b supporting the lamp body 28a and a reflector 28c surrounding the lamp body 28a. For example, the lamp body 28a is supported by the lamp supporter 28b via a spherical joint 28d in such a manner that an angle formed by the lamp body 28a and the lamp supporter 29b is variable. In addition, an angle of the reflector 28c with respect to the lamp supporter 28b is also variable to follow that of the lamp body 28a. Thus, a direction of the lamp body 28a and the reflector 28c can be adjusted with respect to the spherical joint 28d.

According to the thermal processing unit for a single substrate having the heating lamps described above, since each of the heating lamps 28 is formed in such a manner that a heat radiation direction thereof is variable, the semiconductor wafer w can be heated uniformly within the surface of the semiconductor wafer w without adjusting output of each of the heating lamps 28.

The embodiments of the invention are described above with reference to the drawings. However, the invention is not limited by the above embodiments, but may be modified in a scope of each of claims. For example, the substrate may be a glass substrate or a LCD substrate, instead of a semiconductor wafer. In addition, a thermal processing unit for a single substrate of the invention can conduct any thermal process such as an oxidation, a diffusion, a CVD, an annealing or the like.

What is claimed is:

1. A thermal processing unit for a single substrate comprising:
   a processing chamber vessel whose inside can be made a predetermined atmosphere of a process gas,
   an elevating shaft which can be moved up and down in the processing chamber,
   a supporting body arranged on an upper end of the elevating shaft, which can support a substrate, and
   a heater for heating the substrate supported by the supporting body,
   wherein the supporting body has
   a circular supporting part which supports only substantially all of a peripheral area of the substrate, and
   a pushing-up member which can push up the substrate from on the circular supporting part for conveying the substrate.

2. A thermal processing unit for a single substrate according to claim 1, wherein:
   a ring part is provided on the supporting part for surrounding the peripheral area of the substrate.

3. A thermal processing unit for a single substrate according to claim 1, wherein:
   the pushing-up part has a plurality of point-supporters.

4. A thermal processing unit for a single substrate according to claim 1, wherein:
   the elevating shaft has an outside pipe and an inside rod,
   the circular supporting part of the supporting body is provided on an upper end of the inside rod.

5. A thermal processing unit for a single substrate according to claim 4, wherein:
   a temperature measuring gauge is connected to the inside rod of the elevating shaft.

6. A thermal processing unit for a single substrate according to claim 4, wherein:
   a temperature measuring gauge is connected to the outside pipe of the elevating shaft.

7. A thermal processing unit for a single substrate according to claim 4, wherein:
   the outside pipe of the elevating shaft and the circular supporting part of the supporting body are hermetically connected via a tubular or funnel-shaped connector.

8. A thermal processing unit for a single substrate according to claim 1, wherein:
   the heater is arranged outside the processing chamber vessel and spherically around a center of the substrate.

9. A thermal processing unit for a single substrate according to claim 8, wherein:
   the heater consists of a plurality of heating lamps.

10. A thermal processing unit for a single substrate according to claim 9, wherein:
    a heat-radiating direction of each of the plurality of heating lamps is adjustable.

11. A thermal processing unit for a single substrate according to claim 1, wherein:
    a showerhead is provided at an upper portion of the processing chamber vessel for introducing a process gas into the processing chamber vessel.

12. A thermal processing unit for a single substrate according to claim 11, wherein:
    the showerhead is formed convexly toward the central area of the substrate.

13. A thermal processing unit for a single substrate according to claim 1, wherein:
    the heater is arranged outside the processing chamber vessel in such a manner that the heater oppositely faces a surface of the substrate.

14. A thermal processing unit for a single substrate according to claim 13, wherein:
    the heater consists of a resistance heater.

15. A thermal processing unit for a single substrate according to claim 1, wherein:
    an assistant heater is provided outside the processing chamber vessel for heating an area other than a thermal processing area for the substrate.

* * * * *